(12) United States Patent
Akatsuka et al.

(10) Patent No.: US 7,133,705 B2
(45) Date of Patent: Nov. 7, 2006

(54) PORTABLE POWER AMPLIFIER

(75) Inventors: Terumoto Akatsuka, Aichi (JP);
Keisuke Utsunomiya, Aichi (JP);
Haruki Owaki, Gifu (JP); Motoyoshi Kitagawa, Gifu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 453 days.

(21) Appl. No.: 10/343,966

(22) PCT Filed: May 23, 2002

(86) PCT No.: PCT/JP02/05013

§ 371 (c)(1),
(2), (4) Date: Oct. 9, 2003

(87) PCT Pub. No.: WO02/096175

PCT Pub. Date: Nov. 28, 2002

(65) Prior Publication Data

US 2005/0099228 A1    May 12, 2005

(30) Foreign Application Priority Data

May 24, 2001 (JP) ............................. 2001-154960
Apr. 24, 2002 (JP) ............................. 2002-121934

(51) Int. Cl.
*H04M 1/00* (2006.01)
*H05K 7/20* (2006.01)

(52) U.S. Cl. ............................. 455/575.1; 455/575.8; 455/128; 330/66; 330/68; 361/752; 361/816; 361/688; 361/709; 361/719; 257/704

(58) Field of Classification Search ................ 455/572, 455/575.1, 575.5, 575.8, 128, 217, 346, 347; 361/687, 688, 709, 714, 718, 719, 720, 724, 361/818, 816, 753, 752, 757; 330/66, 68; 257/704

See application file for complete search history.

(56) References Cited

U.S. PATENT DOCUMENTS

| 5,379,185 | A |   | 1/1995 | Griffin et al. |
|-----------|---|---|--------|-----------------|
| 5,552,636 | A | * | 9/1996 | Darveaux .................... 257/709 |
| 5,633,786 | A | * | 5/1997 | Matuszewski et al. ...... 361/818 |
| 5,748,455 | A | * | 5/1998 | Phillips et al. .............. 361/818 |
| 6,025,991 | A | * | 2/2000 | Saito .......................... 361/704 |
| 6,134,110 | A | * | 10/2000 | Langari ....................... 361/700 |

(Continued)

FOREIGN PATENT DOCUMENTS

EP     0 393 236     10/1990

(Continued)

OTHER PUBLICATIONS

Microfilm of the specification and drawings annexed to the request of Japanese Utility Model application No. 56527/1998 (Laid-Open No. 160735/1989), (Toyo Communication Equipment Co., Ltd.), Nov. 8, 1989, Full text; Figs. 1, 2 (Family: none) with English translation.

*Primary Examiner*—Quochien B. Vuong
*Assistant Examiner*—Andrew Wendell
(74) *Attorney, Agent, or Firm*—Wenderoth, Lind & Ponack, L.L.P.

(57) ABSTRACT

A portable power amplifier includes portable encapsulating cases, a printed board incorporated in those encapsulating cases, and a power amplifying device mounted on this printed board. An antenna switch and an antenna are provided near the power amplifying device, which is connected to those components in a pattern. This structure improves heat dissipation efficiency of the portable power amplifier.

29 Claims, 4 Drawing Sheets

U.S. PATENT DOCUMENTS

| | | | |
|---|---|---|---|
| 6,198,444 B1 * | 3/2001 | Sailsman et al. | 343/702 |
| 6,501,019 B1 * | 12/2002 | Sato et al. | 174/377 |
| 6,504,727 B1 * | 1/2003 | Kitamura et al. | 361/800 |
| 6,600,663 B1 * | 7/2003 | Koleda | 361/816 |
| 7,061,774 B1 * | 6/2006 | Zhang | 361/818 |
| 2002/0089380 A1 * | 7/2002 | Fujioka et al. | 330/302 |

FOREIGN PATENT DOCUMENTS

| | | |
|---|---|---|
| EP | 0 506 122 | 9/1992 |
| JP | 3-263901 | 11/1991 |
| JP | 5-41586 | 10/1993 |
| JP | 9-107203 | 4/1997 |
| JP | 2624362 | 4/1997 |
| JP | 2925475 | 5/1999 |
| JP | 11-204970 | 7/1999 |

* cited by examiner

PORTABLE POWER AMPLIFIER

TECHNICAL FIELD

The present invention relates to portable power amplifiers to be used in portable apparatuses.

BACKGROUND ART

A conventional portable power amplifier used in portable apparatuses is a simple one because the apparatuses are portable, which regulates a specification of their power amplifiers, so that the power amplifier is not a large size, or does not dissipate heat efficiently. To be specific, as shown in FIG. 7, power amplifying device 2 is mounted on an upper face of printed board 1 disposed in a portable outer case typically used in a portable phone. Heat generated from amplifying device 2 travels through through-holes 3 and is dissipated from pattern 4 prepared on a rear face of printed board 1. However, in this conventional structure, pattern 4 is limited in size as a heat-sink and cannot dissipate heat sufficiently. A use of a dedicated large heat-sink would enlarge the apparatus and make it unfit for portable use.

SUMMARY OF THE INVENTION

A portable power amplifier comprising the following elements is provided:
 a portable outer case;
 a printed board disposed in the outer case;
 a power amplifying device mounted to the printed board; and
 a heat resisting component disposed close to the amplifying device and coupled to the amplifying device via heat conductive material.

DETAILED DESCRIPTION OF THE PREFERRED EMBODIMENTS

Exemplary embodiments of the present invention are demonstrated hereinafter, using a portable phone that employs a portable power amplifier, with reference to FIG. 1 through FIG. 6.

Exemplary Embodiment 1

Figure 6:
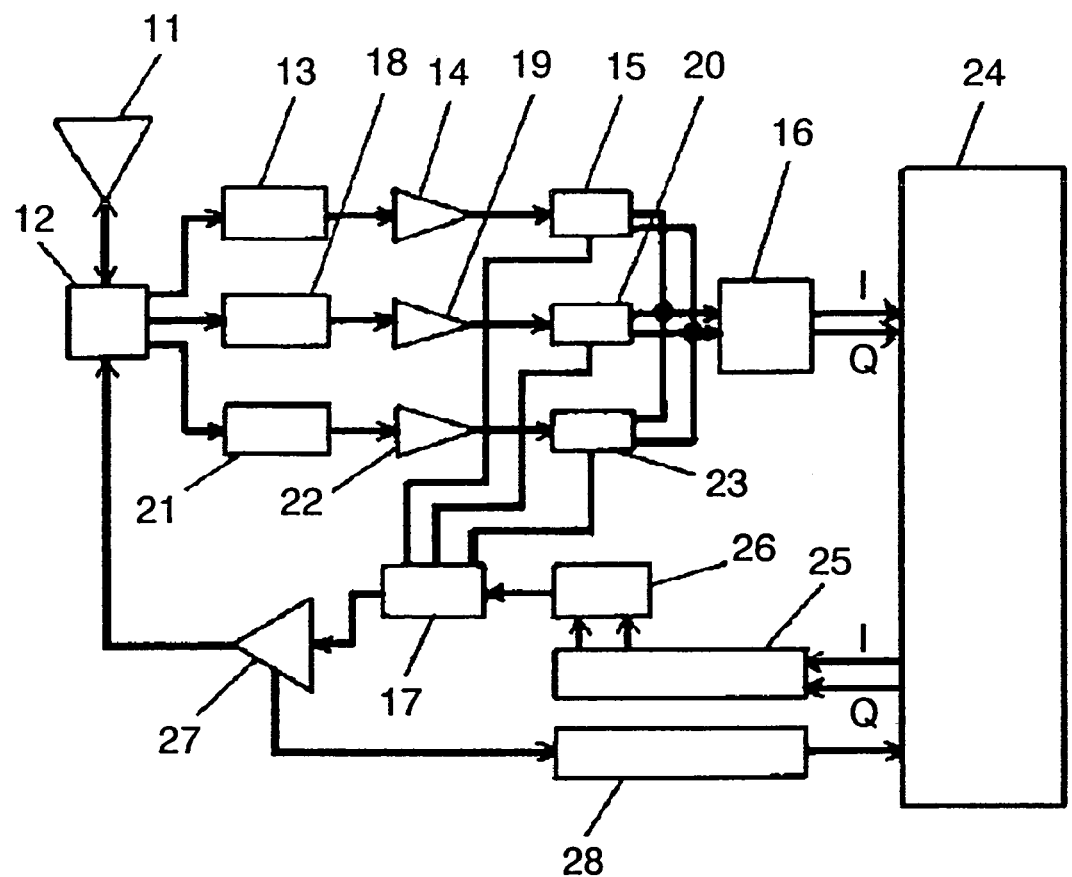
FIG. 6 is a block diagram of a portable phone employing a portable power amplifier of the present invention.
Figure 7:
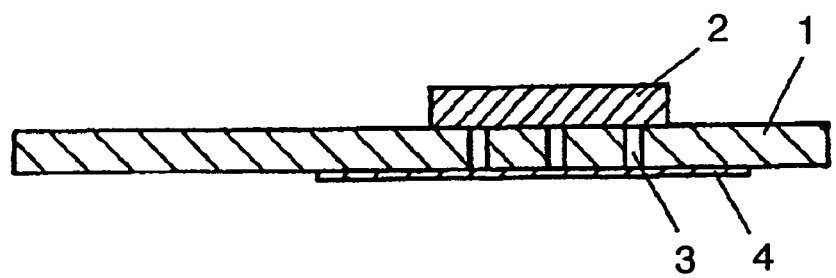
FIG. 7 shows a sectional view of an essential part of a conventional portable power amplifier.

FIG. 6 shows a block diagram of a portable phone employing a portable power amplifier in accordance with a first embodiment of the present invention. In FIG. 6, antenna 11 is coupled to a common terminal of antenna switch 12, which has three outputs and one input switchable upon request. A first output from switch 12 is supplied to first quadrature demodulator 15 of GSM (Global System for Mobile communication) band via band pass filter 13 that passes signals of GSM band (900 MHz) and via low noise amplifier (LNA) 14. First demodulator 15 supplies its output to DC offset canceler 16. A first output from voltage control oscillator (VCO) 17 is supplied to another input terminal of first demodulator 15.

A second output from antenna switch 12 is supplied to second quadrature demodulator 20 of DCS band (1800 MHz) via band pass filter 18 that passes signals in the DCS band and via LNA 19. Then demodulator 20 supplies its output to DC offset canceler 16. A second output from VCO 17 is supplied to another input terminal of second quadrature demodulator 20.

A third output from antenna switch 12 is supplied to third quadrature demodulator 23 of PCS band (1900 MHz) via band pass filter 21 that passes signals of the PCS band and via LNA 22. Demodulator 23 supplies its output to DC offset canceler 16. A third output from VCO 17 is supplied to another input terminal of third quadrature demodulator 23.

An output from DC offset canceler 16 is supplied to processing circuit 24 that includes a base-band signal processing circuit, an AD conversion circuit and a DA conversion circuit. An output from processing circuit 24 is supplied to PLL circuit 26 via quadrature demodulator 25. An output from PLL circuit 26 is supplied to VCO 17 for controlling VCO 17. An output from VCO 17 is supplied to an input terminal of antenna switch 12 via power amplifying device (hereinafter referred to simply as PA) 27. An output level of PA 27 is detected by power detection circuit 28, and fed back to processing circuit 24.

PA 27 amplifies an input of ca. 3 mW approximately 1300 times and outputs a signal of ca. 4 W. PA 27 thus needs a large power, and its heat dissipation capacity is raised as a problem in order to gain output efficiently. The present invention addresses mainly PA 27, VCO 17, antenna switch 12 and the vicinity of antenna 11.

Figure 1:
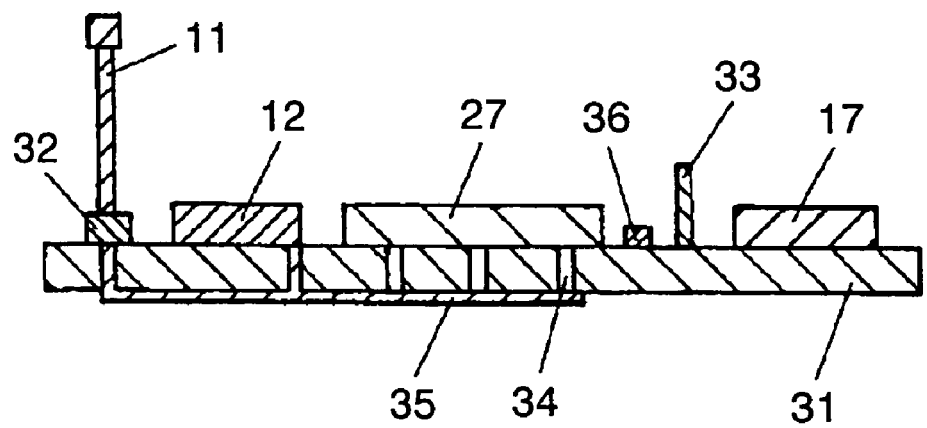
FIG. 1 shows a sectional view of an essential part of a portable power amplifier in accordance with a first exemplary embodiment of the present invention.

FIG. 1 shows a sectional view of an essential part of the portable power amplifier in accordance with a first exemplary embodiment of the present invention. In FIG. 1, PA 27, antenna switch 12, connector 32 coupled to antenna 11 and VCO 17 are mounted on a surface of printed board 31. Metallic partition plate 33 is vertically disposed between PA 27 and VCO 17 and separates VCO 17 thermally from PA 27 for preventing VCO 17 from adversely influencing PA 27 with its frequency deviation, level changes, phase noises, and oscillation stop.

Heat generated from PA 27 travels to pattern 35 (used as an example of heat conductive material) formed on a rear face of printed board 31 via through-holes 34. Pattern 35 is disposed adjacent to a heat resisting outer case of antenna switch 12 as well as to antenna switch 12 per se, and is coupled to heat resisting connector 32.

As such, antenna switch 12 and connector 32 are placed close to PA 27, thereby reducing heat resistance of pattern 35. As a result, antenna 11 and antenna switch 12 can efficiently dissipate heat of PA 27. Pattern 35 is preferably as wide or thick as possible in order to reduce its heat resistance. The number of through-holes 34 is preferably as many as possible because of the same reason.

In a case that a multi-layer board is used as printed board 31, pattern 35 is preferably prepared as a first layer so that heat resistance can be lowered. FIG. 1 does not show an outer case; however, a case covering printed board 31 is actually available. In this embodiment a rod antenna is used as antenna 11; however, an antenna formed of chip components can be used. Antenna 11 can be exposed from the outer case, and this exposure substantially increases a heat dissipation performance. A surface of pattern 35 is roughened in advance by buffing or chemical polishing, so that this pattern formed of copper foil dissipates heat with ease.

Chip capacitor 36 is mounted close to PA 27 and works to cut off a current or reduce noises of a power supply (capacitor 36 is hereinafter referred to as a bypass capacitor). Since capacitor 36 is placed close to PA 27, its capacitance can be changed by heat from PA 27. However, this change does not affect the work of capacitor 36 because capacitor 36 just cuts of a current or reduces noises. Thus, chip capacitor 36 placed close to PA 27 can dissipate heat from PA 27 without losing its high-frequency performance.

Exemplary Embodiment 2

Figure 2:
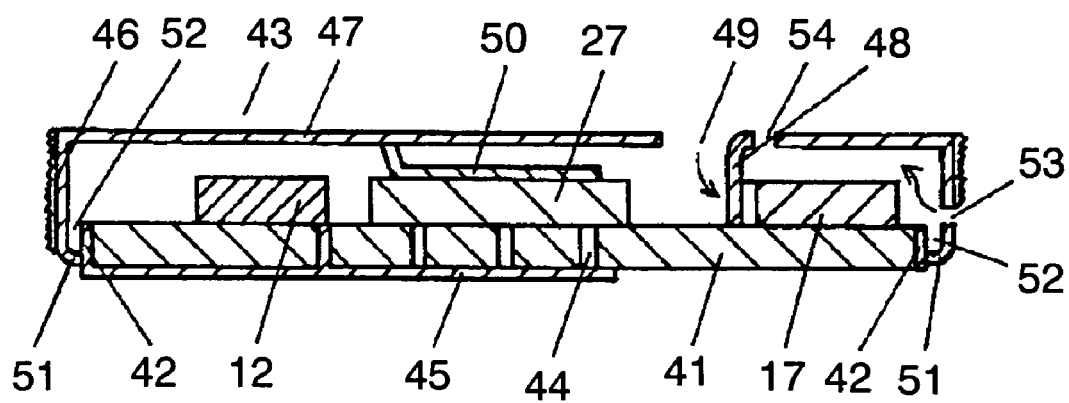
FIG. 2 shows a sectional view of an essential part of a portable power amplifier in accordance with a second exemplary embodiment of the present invention.

FIG. 2 shows a sectional view of an essential part of a portable power amplifier in accordance with a second exemplary embodiment. In FIG. 2, soldering section 42 is disposed on a side face of printed board 41. Power amplifying device (PA) 27, antenna switch 12, and VCO 17 are mounted on a surface of printed board 41. Metallic shielding case 43 working as an outer case covers all components mounted on printed board 41. Heat generated from PA 27 travels to pattern 45 formed on a rear face of printed board 41 via through-holes 44. Pattern 45 is coupled to soldering section 42. As such, pattern 45 is coupled to heat resisting shielding case 43 via an outer case of antenna switch 12, antenna switch 12 per se and soldering section 42.

Heat generated from PA 27 can be dissipated efficiently from shielding case 43 prepared for shielding electronics components, the outer case of antenna switch 12, and antenna switch 12 per se.

Pattern 45 is preferably as thick or wide as possible in order to reduce its heat resistance. The number of through-holes 44 is preferably as many as possible for the same reason. Antenna switch 12 is disposed close to soldering section 42 and adjacent to PA 27. In a case that a multi-layer board is used as printed board 41, pattern 45 is preferably prepared as a first layer so that heat resistance can be lowered. In FIG. 2, no outer case is shown; however, an outer case for covering the shielding case 43 is actually available.

Top plate 47 of shielding case 43 at PA 27 side is bent, thereby forming partition plate 48, which separates VCO 17 thermally from PA 27. This separation can reduce adverse influence from VCO 17 such as frequency deviation, level changes, phase noises, and oscillation stop. Hole 49 is formed on shielding case 43 at PA 27 side, and this hole 49 can dissipate heat from PA 27.

Part of top plate 47 of shielding case 43 above PA 27 is cut and bent to form slip 50, then slip 50 is elastically urged against a top plate of PA 27. This structure allows shielding case 43 to dissipate heat directly from PA 27, thereby obtaining an advantage of heat-dissipation.

Further, side face 46 of shielding case 43 is roughened, thereby enlarging a surface area for increasing a heat dissipation efficiency. Top plate 47 is smoother than side face 46 and can be sucked with a nozzle, thereby allowing handling of the amplifier with ease, and case 43 looks fine on the top plate.

Burr 51 is formed at an end of side face 46 toward soldering section 42, so that space 52 is produced between side face 46 and soldering section 42. Therefore, space 52 is positively filled with solder due to a capillary action during soldering, so that soldering section 42 is jointed with shielding case 43 with a large area. As a result, heat resistance due to a joint between pattern 45 and case 43 is reduced, and heat dissipation thus can be increased.

In manufacturing shielding case 43, a metal plate is cut by punching, thereby forming burr 51 at the end of side face 46, then the plate is bent at a right angle in a cutting direction, so that side face 46 is formed.

Intake hole 53 is prepared on case 43, for outer air to flow-in, near to VCO 17 at soldering section 42 side. Outlet hole 54 is prepared on case 43 near to PA 27. Cool outer air flows in through intake hole 53, thereby cooling VCO 17 that has been warmed by PA 27. Then the air flows out through outlet hole 54. This structure prevents VCO 17 from lowering its performance (such as degradation of phase noises, oscillation stop, or frequency deviation) due to heat.

Exemplary Embodiment 3

Figure 3:
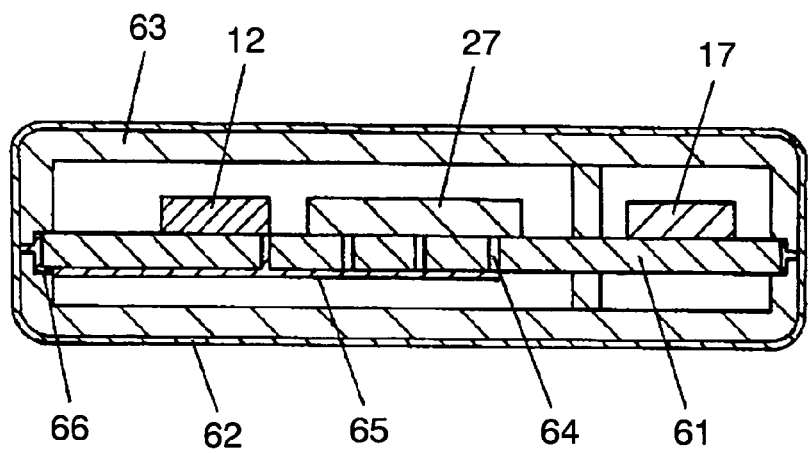
FIG. 3 shows a sectional view of an essential part of a portable power amplifier in accordance with a third exemplary embodiment of the present invention.

FIG. 3 shows a sectional view of essential parts of a portable phone in accordance with a third exemplary embodiment. In FIG. 3, power amplifying device (PA) 27, antenna switch 12, and VCO 17 are mounted on a surface of printed board 61. Heat resisting encapsulating cases 62 and 63 cover all components mounted on printed board 61. Heat generated from PA 27 travels to heat conductive pattern 65 formed on a rear face of printed board 61 via through-holes 64. Pattern 65 is coupled to encapsulating cases 62 and 63 to which heat conductive material is attached, so that pattern 65 is thermally coupled to overall surfaces of encapsulating cases 62 and 63. As a result, pattern 65 is coupled to an outer case of antenna switch 12 disposed adjacent to PA 27 and encapsulating cases 62, 63 disposed adjacent to antenna switch 12.

The heat generated from PA 27 can be dissipated from encapsulating cases 62, 63 prepared for protecting electronics components. A placement of junction point 66 of antenna switch 12, encapsulating cases 62 and 63 close to PA 27 reduces a routing of pattern 65. Then heat resistance is lowered, and heat of PA 27 can be dissipated efficiently from encapsulating cases 62, 63 and antenna switch 12. Pattern 65 is preferably as thick as possible in order to reduce its heat resistance. The number of through-holes 64 is preferably as many as possible for the same reason. In a case that a multi-layer board is used as printed board 61, heat conductive pattern 65 is preferably prepared as a first layer so that heat resistance can be lowered.

Figure 4:
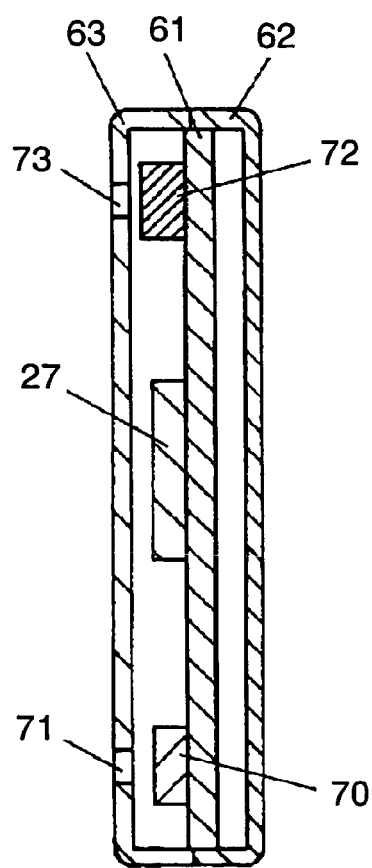
FIG. 4 shows a sectional view of an essential part of a portable phone employing the portable power amplifier in accordance with the third exemplary embodiment of the present invention.

FIG. 4 shows a sectional view of essential parts of a portable phone in accordance with the third embodiment. In FIG. 4, first hole 71 is provided in encapsulating case 63 such that hole 71 faces audio input device 70, and second hole 73 is provided in outer case 63 such that hole 73 faces audio output device 72. Power amplifying device (PA) 27 is prepared between audio input device 70 and audio output device 72.

The portable phone discussed above is used such that audio input device 70 is brought close to a user's mouth and audio output device 72 is brought close to the user's ear. As a result, audio input device 70 takes its place below PA 27 and audio output device 72 takes its place above PA 27 when the portable phone is in use. First hole 71 and second hole 73 are thus placed such that they face audio input device 70 and audio output device 72 respectively. Therefore, air flows in through first hole 71 opposite to audio input device 70, and flows out through second hole 73 opposite to audio output device 72. This mechanism allows open air to flow into outer cases 62 and 63 through first hole 71 of audio input device 70, and heated air to flow out through second hole 73 of audio output device 72, so that PA 27 can be cooled.

Providing PA 27 with spaces 52 shown in FIG. 2 above and below PA 27 will further cool PA 27.

Exemplary Embodiment 4

Figure 5:
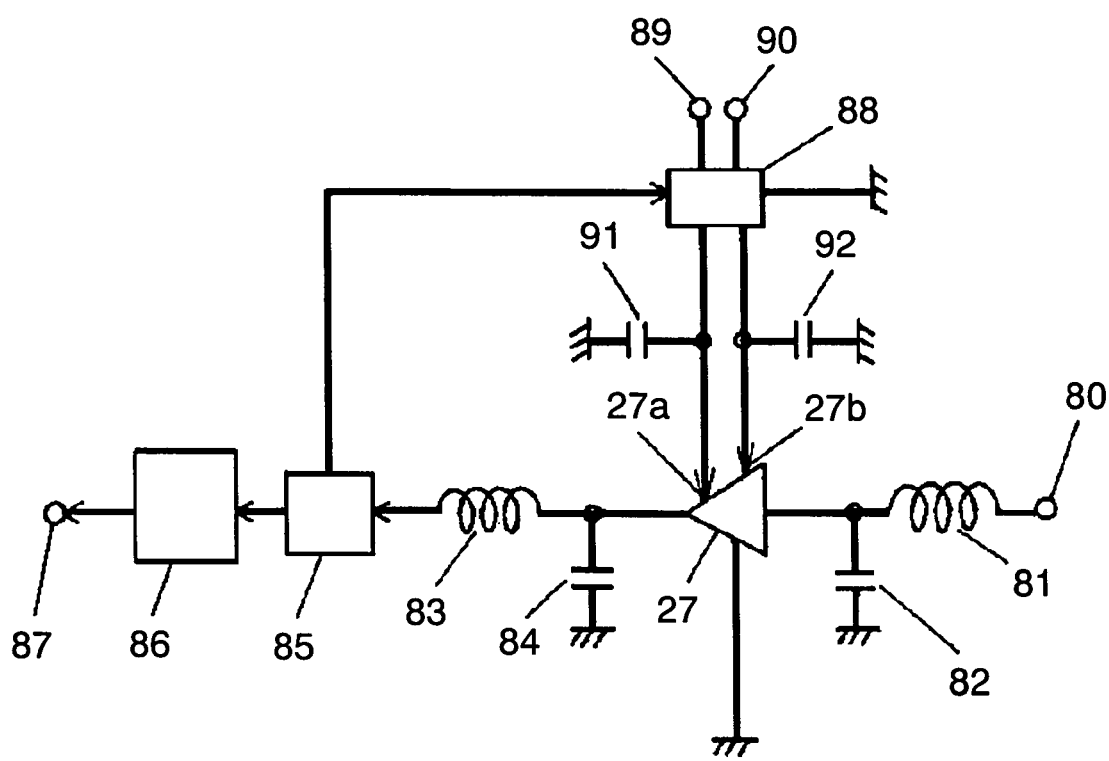
FIG. 5 is a block diagram illustrating a vicinity of a power amplifying device in accordance with a fourth exemplary embodiment of the present invention.

FIG. 5 is a block diagram illustrating a vicinity of the portable power amplifier in accordance with a fourth exemplary embodiment. In FIG. 5, an output from VCO 17 is supplied to input terminal 80 of power amplifying device (PA) 27. Input terminal 80 is coupled to a first matching circuit formed of inductor 81 and chip capacitor 82. Inductor 81 is connected to PA 27 in series, and chip capacitor 82 is connected to PA 27 in parallel. The first matching circuit determines constants such that impedance of VCO 17 is matched with PA 27.

An output from PA 27 is supplied to a second matching circuit formed of inductor 83 and chip capacitor 84. Inductor 83 is coupled to PA 27 in series, and chip capacitor 84 is coupled to PA 27 in parallel.

In this fourth embodiment, chip capacitors 82 and 84 are reflow-soldered, so that they take advantage of a self-alignment effect of reflow soldering. As a result, capacitors 82 and 84 are accurately soldered onto given positions of a pattern free from unnecessary inductance. Thus, an excellent power amplifying can be expected, and a portable power amplifier of superb characteristics is obtainable.

An output from the second matching circuit is supplied to directional coupler 85, of which a first output is supplied to output terminal 87 via low pass filter 86. Output terminal 87 is coupled to an input terminal of antenna switch 12. A second output from directional coupler 85 is supplied to automatic power control circuit 88, of which an output is supplied to power control terminal 27a of PA 27.

Control terminal 89 regulates an amplification degree of PA 27 from outside and is coupled to automatic power control circuit 88. Control terminal 90 controls on-off of power supply of PA 27 from outside and is coupled to an input terminal of circuit 88 and also coupled to power supply control terminal 27b of PA 27 via circuit 88.

Between circuit 88 and power control terminal 27a, grounded chip capacitor 91 is coupled, and between circuit 88 and power supply control terminal 27b grounded chip capacitor 92 is coupled. These capacitors 91 and 92 can attenuate noises riding on terminals 27a and 27b, and since these two capacitors are placed close to PA 27, they can dissipate heat generated from PA 27.

Chip capacitors 91 and 92 are reflow-soldered and thus heat resistive, therefore, they can be used close to PA 27 without any problem. Since chip capacitors 91 and 92 are used to attenuate noises, a function of attenuating high-frequency noises is not damaged even if capacitance is somewhat varied by heat from PA 27, and a stable amplification is obtainable.

Chip capacitors 82 and 84 are elements of first and second matching circuits respectively. Respective ones of electrodes of capacitors 82 and 84 are grounded near to shielding case 47 as shown in FIG. 2. This structure allows heat of PA 27 to dissipate from shielding case 47 via the grounding and capacitors 82 and 84.

This structure also suppresses temperatures of capacitors 82 and 84 from rising, so that changes of impedance of the matching circuits due to temperature drift can be suppressed. As a result, a signal loss due to heat generated from Pa 27 can be minimized.

Instead of the second matching circuit, low pass filter 86 can be directly coupled to an output terminal of PA 27. In this case, a chip capacitor that is an element of filter 86, and of which one of the electrodes is grounded, is preferably placed close to shielding case 47. This chip capacitor is reflow-soldered and thus accurately positioned, which assures production of a low pass filter having a stable cut-off frequency and that is less affected by temperature.

Instead of chip inductor 81, 83, a pattern inductor can be used. And an inductor that is an element of low pass filter 86 can be used as a pattern inductor. In this case, the pattern inductor can dissipate heat, and is strong enough to withstand vibrations or shocks. Further, it can be adjusted to a given inductance by laser trimming, so that an accurate portable power amplifier is obtainable.

In a case when input terminal 80 receives an output from an oscillator of an open-collector, a dc is applied to terminal 80 in order to power the oscillator. In this case the dc should be prevented from being applied to PA 27, so that a dc cut-off capacitor is disposed between input terminal 80 and PA 27. Since this capacitor can just cut off the dc, it keeps working even if heat from PA 27 changes its capacitance somewhat. This dc cut-off capacitor is inserted between input terminal 80 and PA 27, so that it is placed close to PA 27, thereby dissipating heat of PA 27.

As discussed above, the portable power amplifier of the present invention comprises the following elements:
a portable outer case;
a printed board disposed in the outer case; and
a power amplifying device mounted to the printed board.

A heat resisting component is disposed in the vicinity of the power amplifying device, and coupled to the power amplifying device via heat conductive material, so that the heat resisting component has two functions; namely, the component as itself and as a heat sink. As a result, heat can be well dissipated and also the portable power amplifier can be downsized without having an independent heat sink that would enlarge the portable power amplifier.

Since the power amplifying device is mounted on a printed board, a printed pattern can be fully utilized as heat conductive material, so that the portable power amplifiers can be manufactured with ease. The structure discussed above allows eliminating a heat sink from the printed board, so that wiring can be designed with ease and the number of components can be reduced.

INDUSTRIAL APPLICABILITY

The present invention relates to a portable power amplifier to be used in portable apparatuses, and aims to provide a portable power amplifier that can dissipate heat efficiently and can be fit in the portable apparatuses without changing sizes of the apparatuses.

The invention claimed is:
1. A portable power amplifier comprising:
a printed board disposed in a shielding case, said shielding case including a side plate and a top plate for covering a component side of said printed board, said printed board having an end including a soldering section, and existing between said side plate and said soldering section is a space for being filled with solder via capillary action;

a power amplifying device mounted to said printed board; and a heat resisting component disposed in a vicinity of said power amplifying device and coupled to said power amplifying device via heat conductive material.

2. The portable power amplifier according to claim 1, further comprising:

a burr extending from said side plate toward said soldering section for being connected with said soldering section.

3. The portable power amplifier according to claim 2, wherein said top plate includes a part that is cut and bent, with said part being in contact with a top of said power amplifying device.

4. The portable power amplifier according to claim 3, further comprising:

a high frequency circuit in a vicinity of said power amplifying device, wherein said top plate further includes (i) another part that is cut and bent, with said another part defining a partition between said power amplifying device and said high frequency circuit, and (ii) a hole, produced by the cutting and bending of said another part, that is on a power amplifying device side of said partition.

5. The portable power amplifier according to claim 4, further comprising:

an air intake hole in a vicinity of said soldering section, said air intake hole being in said side plate on a high frequency circuit side of said partition; and an air outlet hole in a vicinity of said power amplifying device, said air outlet hole being in said top plate.

6. The portable power amplifier according to claim 5, wherein said side plate is rougher than said top plate.

7. The portable power amplifier according to claim 6, wherein said shielding case comprises a metallic outer case.

8. The portable power amplifier according to claim 2, further comprising:

a high frequency circuit in a vicinity of said power amplifying device;

a partition between said power amplifying device and said high frequency circuit;

a hole, in said top plate, on a power amplifying device side of said partition;

an air intake hole in a vicinity of said soldering section, said air intake hole being in said side plate on a high frequency circuit side of said partition; and an air outlet hole in a vicinity of said power amplifying device, said air outlet hole being in said top plate.

9. The portable power amplifier according to claim 8, wherein said high frequency circuit comprises a voltage controlling oscillator.

10. The portable power amplifier according to claim 2, further comprising:

a voltage controlling oscillator in a vicinity of said power amplifying device.

11. The portable power amplifier according to claim 2, wherein said shielding case is metallic.

12. The portable power amplifier according to claim 1, wherein said top plate includes a part that is cut and bent, with said part being in contact with a top of said power amplifying device.

13. The portable power amplifier according to claim 1, further comprising:

a high frequency circuit in a vicinity of said power amplifying device, wherein said top plate includes (i) a part that is cut and bent, with said part defining a partition between said power amplifying device and said high frequency circuit, and (ii) a hole, produced by the cutting and bending of said part, that is on a power amplifying device side of said partition.

14. The portable power amplifier according to claim 13, further comprising:

an air intake hole in a vicinity of said soldering section, said air intake hole being in said side plate on a high frequency circuit side of said partition; and an air outlet hole in a vicinity of said power amplifying device, said air outlet hole being in said top plate.

15. The portable power amplifier according to claim 13, wherein said high frequency circuit comprises a voltage controlling oscillator.

16. The portable power amplifier according to claim 1, wherein said shielding case is metallic, and further comprising:

a filter coupled to an output terminal of said power amplifying device, said filter including chip components, with at least one of said chip components being between said output terminal and grounding, and with said grounding being near said shielding case.

17. The portable power amplifier according to claim 16, wherein said filter includes a chip inductor coupled to said output terminal of said power amplifying device, with said chip inductor being reflow-soldered to said printed board.

18. The portable power amplifier according to claim 16, further comprising:

a pattern inductor coupled to said output terminal of said power amplifying device.

19. The portable power amplifier according to claim 1, wherein said side plate is rougher than said top plate.

20. The portable power amplifier according to claim 2, wherein said top plate includes a part that is in contact with a top of said power amplifying device.

21. The portable power amplifier according to claim 1, wherein said shielding case includes a first hole and a second hole, with said power amplifying device being positioned between said first hole and said second hole so as to be cooled by air entering said first hole and exiting said second hole.

22. The portable power amplifier according to claim 1, further comprising:
   an audio input device; and
   an audio output device disposed above said audio input device,
   wherein said power amplifying device is between said audio input device and said audio output device.

23. The portable power amplifier according to claim 1, further comprising:
   a chip capacitor between a power control terminal of said power amplifying device and grounding.

24. The portable power amplifier according to claim 1, further comprising:
   a chip capacitor between a power supply terminal of said power amplifying device and grounding.

25. The portable power amplifier according to claim 1, further comprising:
   an impedance matching circuit coupled to an input terminal of said power amplifying device, said impedance matching circuit including a pattern inductance.

26. The portable power amplifier according to claim 1, further comprising:
   an impedance matching circuit coupled to an input terminal of said power amplifying device, said impedance matching circuit including chip components that are reflow-soldered.

27. The portable power amplifier according to claim 1, further comprising:
   a dc cut-off chip capacitor coupled in series to an input terminal of said power amplifying device.

28. The portable power amplifier according to claim 1, wherein said shielding case is metallic, and further comprising:
   a grounded chip component, with grounding for said chip component being near said shielding case.

29. The portable power amplifier according to claim 1, wherein
   said shielding case comprises an outer case.

* * * * *